(12) United States Patent
Kilroy et al.

(10) Patent No.: US 10,433,449 B2
(45) Date of Patent: Oct. 1, 2019

(54) DOUBLE LINE REPLACEABLE MODULE LOCKING BRACKET

(71) Applicant: Hamilton Sundstrand Corporation, Charlotte, NC (US)

(72) Inventors: Kevin Donald Kilroy, Rockford, IL (US); Steven E. Jackson, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 462 days.

(21) Appl. No.: 15/207,983

(22) Filed: Jul. 12, 2016

(65) Prior Publication Data

US 2018/0020565 A1    Jan. 18, 2018

(51) Int. Cl.
*H05K 7/20* (2006.01)
*H05K 7/14* (2006.01)

(52) U.S. Cl.
CPC ......... *H05K 7/1404* (2013.01); *H05K 7/1407* (2013.01)

(58) Field of Classification Search
USPC ....................................................... 361/720
See application file for complete search history.

(56) References Cited

U.S. PATENT DOCUMENTS

| 4,354,770 | A | 10/1982 | Block |
| 4,823,951 | A | 4/1989 | Colomina |
| 5,290,122 | A | 3/1994 | Hulme |
| 7,349,221 | B2 * | 3/2008 | Yurko ................. H05K 7/1404 165/80.2 |
| 7,907,421 | B2 | 3/2011 | Chen et al. |
| 8,045,332 | B2 * | 10/2011 | Lee ...................... H05K 7/1404 361/756 |
| 10,034,403 | B1 * | 7/2018 | Flannery ................. F16B 2/14 |
| 2010/0039770 | A1 * | 2/2010 | Danello .............. H05K 7/2049 361/691 |

OTHER PUBLICATIONS

Extended European Search Report dated Jan. 4, 2018 issued during the prosecution of European Patent Application No. 17180672. (6 pages).

* cited by examiner

*Primary Examiner* — Hung S. Bui
(74) *Attorney, Agent, or Firm* — Locke Lord LLP; Daniel J. Fiorello; Joshua L. Jones

(57) ABSTRACT

A locking bracket system for a pair of line replaceable modules (LRMs) includes a locking bracket assembly including an expanding member configured to be actuated to expand; and an extension bracket attached to the expanding member. The extension bracket extends from the expanding member in a direction opposite that the expanding member expands. Each of the expanding member and the extension bracket are configured to compress against a LRM to retain the pair of LRMs to a chassis when the expanding member is in an expanded position.

12 Claims, 3 Drawing Sheets

DOUBLE LINE REPLACEABLE MODULE LOCKING BRACKET

BACKGROUND

1. Field

The present disclosure relates to line replaceable modules (LRMs), more specifically to locking brackets for LRMs.

2. Description of Related Art

When performing maintenance and upgrades to power distribution assemblies, it is desired that line replaceable modules (LRMs) be easily and quickly removed and replaced to prevent high maintenance times. In distribution assemblies subjected to a dynamic (e.g., vibratory) environment, the LRMs need to be secured to the chassis. Traditionally, this is typically done with friction card guides or wedge-lock devices.

A drawback to using wedge-lock devices is that it requires a specific tool to actuate the screw on the wedge-lock device in order to loosen the wedges to remove the LRM and then to expand the wedges to secure the LRM. In addition, this process is not mistake proof. During installation, the technician can forget to actuate the wedge-lock device or not apply the appropriate torque. For every LRM, there is a pair of wedge-lock devices (one for the top of the LRM and one for the bottom of the LRM) required to secure the LRM to the chassis, leaving two possibilities for error for every LRM that is installed.

Such conventional methods and systems have generally been considered satisfactory for their intended purpose. However, there is still a need in the art for improved LRM locking systems. The present disclosure provides a solution for this need.

SUMMARY

A locking bracket system for a pair of line replaceable modules (LRMs) includes a locking bracket assembly including an expanding member configured to be actuated to expand and an extension bracket attached to the expanding member. The extension bracket extends from the expanding member in a direction opposite that the expanding member expands. Each of the expanding member and the extension bracket are configured to compress against a LRM to retain the pair of LRMs to a chassis when the expanding member is in an expanded position.

The system can further include the chassis. The chassis can include a pair of flanges separated by a distance that is large enough to fit the two LRMs and the locking bracket assembly. When the expanding member is engaged, the LRMs are pressed against these flanges by the locking bracket assembly between the LRMs, for example.

The extension bracket can be attached to the expanding member via one or more screws. Any other suitable connection (e.g., adhesive, integral formation) is contemplated herein. The extension bracket can include one or more guide post holes configured to receive a guide post.

The system can include a guide post disposed in each guide post hole. Each guide post can be configured to slide in a chassis guide channel defined in the chassis. In certain embodiments, the extension bracket can include a bracket guide channel configured to receive a shoulder screw disposed in the chassis. The extension bracket can be designed to be at least partially hollow to reduce the weight of the extension bracket.

A method for locking a pair of line replaceable modules (LRMs) to a chassis can include placing a first and second LRM within a first chassis portion, placing a first locking bracket assembly as described above within the first chassis portion between the first and second LRMs, and expanding the expanding member such that the expanding member contacts the first LRM and compresses the first LRM against the first chassis portion and such that the extension bracket contacts the second LRM and compresses the second LRM against the first chassis portion.

The method can further include placing the first and second LRMs into a second chassis portion. The method can include placing a second locking bracket assembly within the second chassis portion between the first and second LRMs to constrain the opposite end of the LRMs against a second pair of chassis flanges. In certain embodiments, the second locking bracket assembly includes a second expanding member configured to be actuated to expand and a second extension bracket attached to the second expanding member, wherein the second extension bracket extends from the second expanding member in a direction opposite that the second expanding member expands, wherein each of the second expanding member and the second extension bracket are configured to compress against the first and second LRMs to retain the first and second LRMs to the second chassis portion when the second expanding member is in an expanded position. In certain embodiments, the second locking bracket assembly can be the same as the first locking bracket assembly, a mirror image, or of different construction.

The method can include aligning one or more guide posts of the first locking bracket with one or more chassis guide channels defined in the first chassis portion. In certain embodiments, the method can include aligning a shoulder screw disposed in the chassis with a bracket guide channel defined in the bracket extension.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
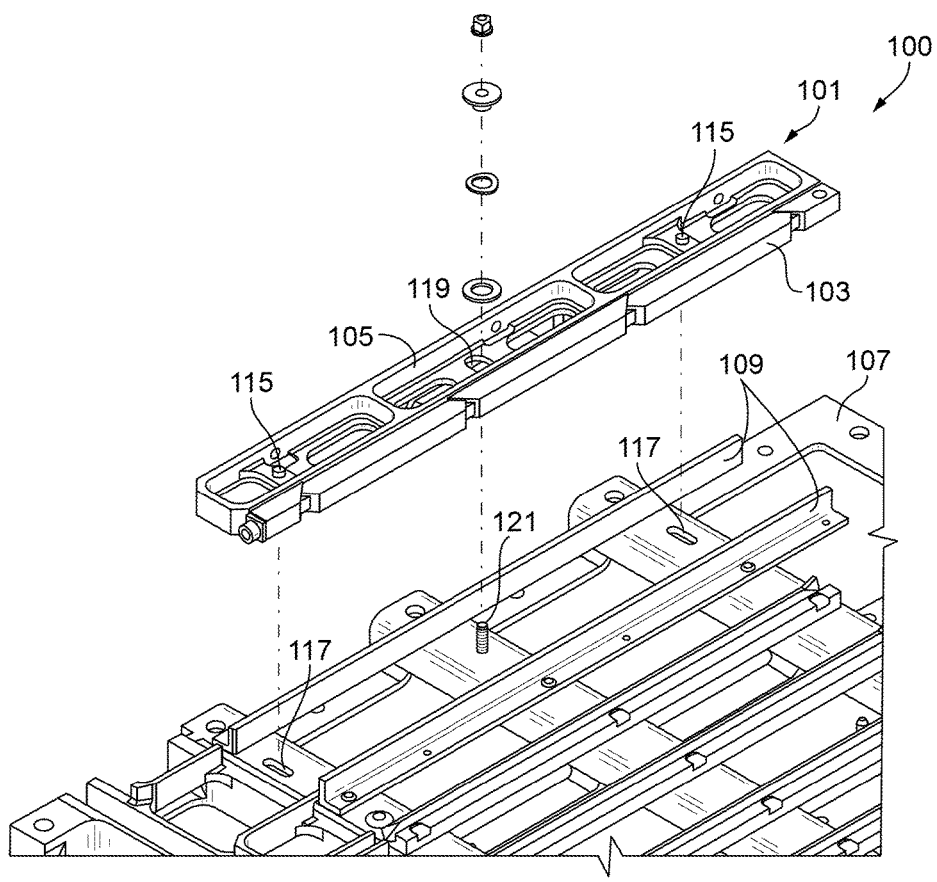
FIG. 1 is a perspective view of an embodiment of a system in accordance with this disclosure.
Figure 2:
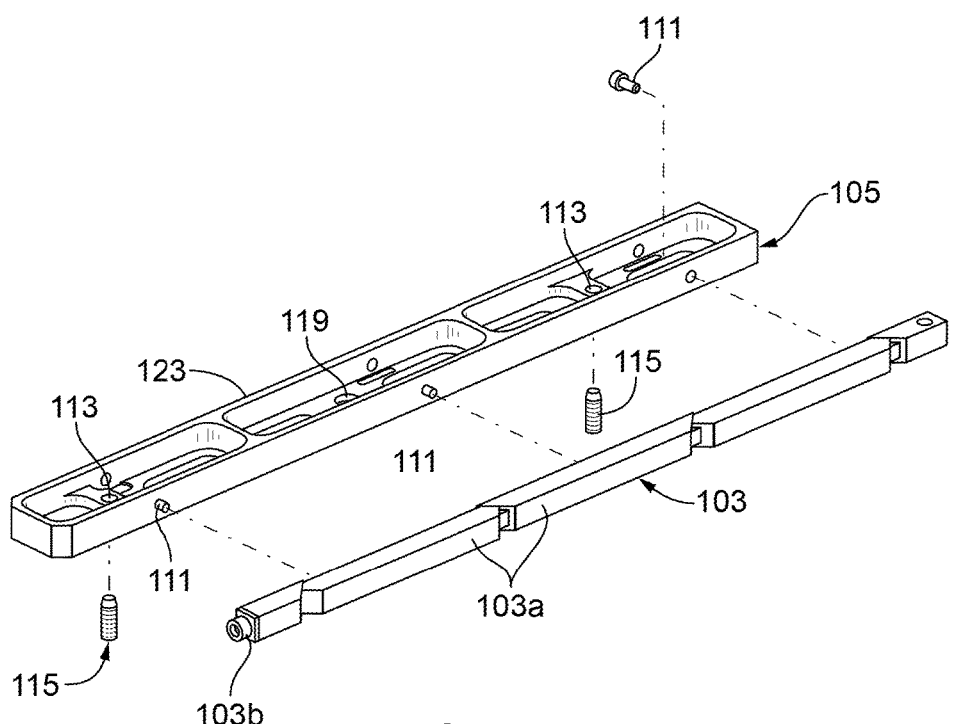
FIG. 2 is a perspective, exploded view of an embodiment of a locking bracket assembly in accordance with this disclosure, showing an expanding member connected to an extension bracket.
Figure 3:
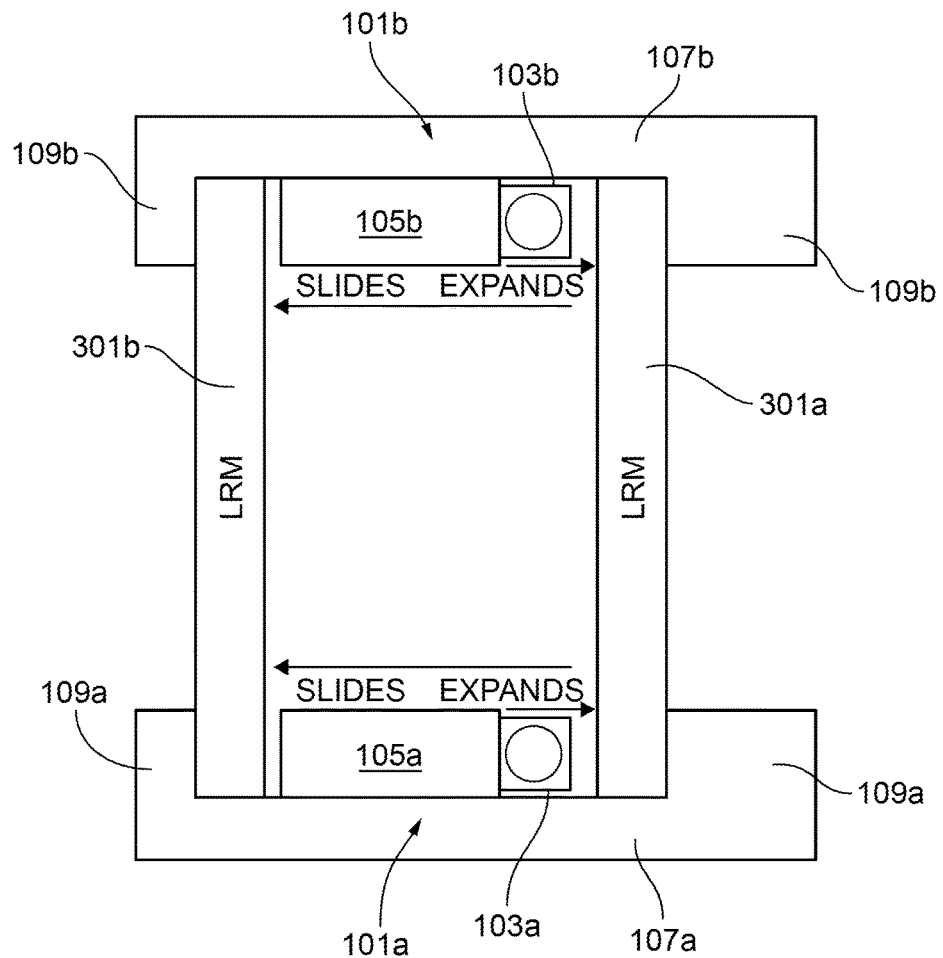
FIG. 3 is a cross-sectional view of an embodiment of a system in accordance with this disclosure, shown having a pair of LRMs retained in a first and second chassis portion by a first and second locking bracket assembly in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2 and 3. The systems and methods described herein can be used to reduce part count, weight, and complexity for locking bracket assemblies for line replaceable modules (LRMs).

Referring to FIG. 1, a locking bracket system 100 for a pair of line replaceable modules (e.g., modules 301a, 301b as shown in FIG. 3) includes a locking bracket assembly 101 including an expanding member 103 configured to be actuated to expand and an extension bracket 105 attached to the expanding member 103. Referring additionally to FIG. 2, the expanding member 103 can include any suitable expanding device as appreciated by those skilled in the art. In certain embodiments, the expanding member 103 includes a wedge-lock device that has a plurality of wedge members 103a and a screw-type actuator 103b as appreciated by those skilled in the art.

As shown, the extension bracket 105 extends from the expanding member 103 in a direction opposite that the expanding member 103 expands, for example. Each of the expanding member 103 and the extension bracket 105 are configured to compress against an LRM 301a, 301b (e.g., separate LRMs on opposite sides of the assembly 101) to retain the pair of LRMs 301a, 301b to a chassis 107 when the expanding member 103 is in an expanded position.

The chassis 107 can include a pair of flanges 109 separated by a distance that is large enough to fit the locking bracket assembly 101 and the two LRMs 301a, 301b, e.g., as shown in FIG. 3.

As shown in FIG. 2, the extension bracket 105 can be attached to the expanding member 103 via one or more screws 111, for example. Any other suitable attachment (e.g., any suitable fastener(s), adhesive, integral formation) is contemplated herein. As is appreciated by those having ordinary skill in the art, instead of manufacturing the extension bracket 105 as a separate item, the extension bracket 105 and the expanding member 103 could be created as a single piece via any suitable method (e.g., additive manufacturing).

The extension bracket 105 can include one or more guide post holes 113 configured to receive a guide post 115. The system 100 can also include a guide post 115 disposed in each guide post hole 113, for example. Each guide post 115 can be configured to slide in a chassis guide channel 117 defined in the chassis 107.

In certain embodiments, the extension bracket 105 can include a bracket guide channel 119 configured to receive a shoulder screw 121 (or any other suitable chassis guide post or attachment device) disposed in the chassis 107. It should be understood, that the extension bracket 105 can include any suitable number of guide posts 115, any suitable number of shoulder screws 121, and/or any suitable number of bracket guide channels 119, or none of both. No alignment is specifically necessary, as would be appreciated by those skilled in the art. However, the guide posts 115 and shoulder screw 121 can allow for the bracket to register with chassis 107 and only allow movement of the extension bracket 105 in a single direction (e.g., opposite the direction of expansion of the expanding member 103). In addition, the shoulder screw 121 can retain the bracket to the chassis. As appreciated by those having ordinary skill in the art, sliding action can be achieved with the use of guide posts 115 and shoulder screw 121 in slotted holes, using tongue and groove connections, and/or in any other suitable manner.

The extension bracket 105 can be made of any suitable material (e.g., aluminum, polymer, rubber), and the material can be selected to minimize weight of the assembly 101. In certain embodiments, the extension bracket 105 can include a soft and/or frictional and/or electrically insulating material at a contact edge 123 of the extension bracket 105 to contact and LRM. The extension bracket 105 can be designed to be at least partially hollow as shown to reduce the weight of the extension bracket 105, as is appreciated by those having ordinary skill in the art.

Referring additionally to FIG. 3, a method for locking a pair of line replaceable modules (LRMs) 301a, 301b to a chassis can include placing a first LRM 301a and second LRM 301b within a first chassis portion 107a. The method can include placing a first locking bracket assembly 101a (e.g., as described above) within the first chassis portion 107a between the first and second LRMs 301a, 301b. The method further includes expanding the expanding member 103a of the first locking bracket assembly 101a such that the expanding member 103a contacts the first LRM 301a and compresses the first LRM 301a against the first chassis portion 107a and such that the extension bracket 105a of the first locking bracket assembly 101a contacts the second LRM 301b and compresses the second LRM 301b against the chassis. As shown, the LRMs can be compressed against flanges 109a of the first chassis portion 107a.

The method can further include placing the first and second LRMs 301a, 301b into a second chassis portion 107b. The method can include placing a second locking bracket assembly 101b within the second chassis portion 107b between the first and second LRMs 301a, 301b. The second locking bracket assembly 101b can be the same and/or similar to the first locking bracket assembly 101a (e.g., such that the second locking bracket assembly 101b includes a second expanding member 103b similar to first expanding member 103a and a second extension bracket 105b similar to first extension bracket 105a).

The method can include aligning one or more guide posts 115 of one or both locking brackets 101a, 101b with one or more chassis guide channels 117 defined in the first or second chassis portion 107a, 107b. In certain embodiments, the method can include attaching a shoulder screw 121 disposed in the first and/or second chassis portion 107a, 107b with a bracket guide channel 119 defined in the first and/or second extension bracket 105a, 105b.

As described above, embodiments can secure two LRMs 301a, 301b using a single pair of expanding members, which reduces part count and complexity. As shown, the expanding member is attached to a slidable extension bracket, rather than the LRMs 301a, 301b directly. In the case of a wedge-lock device, as the screw of the wedge-lock device is tightened, the wedges expand and push on the nearby LRM 301a. As the wedges continue to expand, the extension bracket 105 slides away from the first LRM 301a and into the second LRM 301b, clamping it in place as well.

Embodiments reduce the amount of expanding members needed by half than in traditional systems, reduce the installation/removal time of the LRMs, present less chance for operator error, and provide an overall cost savings.

The methods and systems of the present disclosure, as described above and shown in the drawings, provide for locking bracket systems with superior properties. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A locking bracket system for a pair of line replaceable modules (LRMs), comprising:
    a locking bracket assembly including:
        an expanding member configured to be actuated to expand;
        an extension bracket attached to the expanding member, wherein the extension bracket extends from the expanding member in a direction opposite that the expanding member expands, wherein the extension bracket includes one or more guide post holes configured to receive a guide post; and
        a guide post disposed in each guide post hole, wherein each guide post is configured to slide in a chassis guide channel defined in the chassis,
    wherein each of the expanding member and the extension bracket are configured to compress against a LRM to retain the pair of LRMs to a chassis when the expanding member is in an expanded position.

2. The locking bracket system of claim 1, further comprising the chassis.

3. The locking bracket system of claim 2, wherein the chassis includes a pair of flanges separated by a distance that is large enough to fit the pair of LRMs and the expanding member and the extension bracket between two LRMs.

4. The locking bracket system of claim 1, wherein the extension bracket is attached to the expanding member via one or more screws.

5. The locking bracket system of claim 1, wherein the extension bracket includes a bracket guide channel configured to receive a shoulder screw disposed in the chassis.

6. The locking bracket system of claim 1, wherein the extension bracket is designed to be at least partially hollow to reduce the weight of the extension bracket.

7. A method for locking a pair of line replaceable modules (LRMs) to a chassis, comprising:
    placing a first and second LRM within a first chassis portion;
    placing a first locking bracket assembly within the first chassis portion between the first and second LRMs, the first locking bracket having an expanding member configured to be actuated to expand and an extension bracket attached to the expanding member, wherein the extension bracket extends from the expanding member in a direction opposite that the expanding member expands, wherein each of the expanding member and the extension bracket are configured to compress the against the first and second LRM to retain the first and second LRMs against the first chassis portion when the expanding member is in an expanded position; and
    expanding the expanding member such that the expanding member contacts the first LRM and compresses the first LRM against the first chassis portion and such that the extension bracket contact the second LRM and compresses the second LRM against the first chassis portion; and
    aligning one or more guide posts of the first locking bracket with one or more chassis guide channels defined in the first chassis portion.

8. The method of claim 7, further comprising placing the first and second LRMs into a second chassis portion.

9. The method of claim 8, further comprising placing a second locking bracket assembly within the second chassis portion between the first and second LRMs.

10. The method of claim 9, wherein the second locking bracket assembly includes a second expanding member configured to be actuated to expand and a second extension bracket attached to the second expanding member, wherein the second extension bracket extends from the second expanding member in a direction opposite that the second expanding member expands, wherein each of the second expanding member and the second extension bracket are configured to compress against the first and second LRMs to retain the first and second LRMs against the second chassis portion when the second expanding member is in an expanded position.

11. The method of claim 9, wherein the second locking bracket is the same as the first locking bracket.

12. The method of claim 7, further comprising attaching a shoulder screw disposed in the chassis with a bracket guide channel defined in the extension bracket.

* * * * *